US007408766B2

(12) United States Patent
Oesterhaus et al.

(10) Patent No.: US 7,408,766 B2
(45) Date of Patent: Aug. 5, 2008

(54) MOUNTING AND CONNECTING MEANS FOR ELECTRICAL COMPONENTS

(75) Inventors: Jens Oesterhaus, Detmold (DE); Jörg Sheer, Hüllhorst (DE); Walter Hanning, Detmold (DE); Daniel Brugger, Suhr (CH); Max Hufschmid, Niedererlinsbach (CH); Paul Hug, Liestal (CH)

(73) Assignee: Weidmüller Interface GmbH & Co. KG, Detmold (DE)

( * ) Notice: Subject to any disclaimer, the term of this patent is extended or adjusted under 35 U.S.C. 154(b) by 181 days.

(21) Appl. No.: 11/206,524

(22) Filed: Aug. 18, 2005

(65) Prior Publication Data

US 2006/0044739 A1 Mar. 2, 2006

(30) Foreign Application Priority Data

Aug. 24, 2004 (DE) ....................... 10 2004 041 112
Dec. 28, 2004 (DE) ....................... 10 2004 062 961
Jan. 24, 2005 (DE) ....................... 10 2005 003 199

(51) Int. Cl.
*H02B 1/26* (2006.01)
*H02B 1/04* (2006.01)
*H05K 1/00* (2006.01)
*H01R 9/26* (2006.01)

(52) U.S. Cl. ....................... 361/624; 361/629; 361/631; 361/634; 361/651; 361/652; 439/76.1; 439/716

(58) Field of Classification Search ................. 361/611, 361/624, 627, 633, 634, 636, 637, 640, 648, 361/651, 652, 656, 629, 631; 439/76.1, 716
See application file for complete search history.

(56) References Cited

U.S. PATENT DOCUMENTS

| | | | | | |
|---|---|---|---|---|---|
| 4,041,257 | A | * | 8/1977 | Yancey | 200/1 R |
| 4,153,318 | A | * | 5/1979 | Bishop et al. | 439/121 |
| 4,472,761 | A | * | 9/1984 | Koslosky et al. | 361/638 |
| 4,631,634 | A | * | 12/1986 | Raabe et al. | 361/647 |
| 4,668,035 | A | * | 5/1987 | Jego et al. | 439/207 |
| 4,713,728 | A | * | 12/1987 | Raabe et al. | 361/652 |

(Continued)

FOREIGN PATENT DOCUMENTS

EP 112 232 6/1984

*Primary Examiner*—Jayprakash N Gandhi
*Assistant Examiner*—Bradley H Thomas
(74) *Attorney, Agent, or Firm*—Lawrence E Laubscher, Sr.; Lawrence E Laubscher, Jr.

(57) ABSTRACT

A power supply system for supplying electrical power to at least one load includes a base plate, a support rail and a power supply module fastened to the base plate, at least one bus bar module, and a rail mounting device for mounting the bus bar module on the support rail. The rail mounting device includes conductor members for supplying power from the power supply module to bus bars contained within the bus bar modules, respectively. A first plug has contacts that engage contacts of each of the bus bars of the bus bar module via access slots contained in the cover member thereof, thereby to supply three-phase power to a load such, as a motor, via a heavy-duty power switch and a circuit breaker that are both mounted on the base plate, and associated second and third connecting plugs. Single-phase power is supplied to an auxiliary load, such as an electrical appliance, from two or more bus bars of the bus bar module via a fourth plug.

26 Claims, 15 Drawing Sheets

U.S. PATENT DOCUMENTS 4,752,233 A * 6/1988 Morby et al. ............... 439/212
4,845,592 A * 7/1989 Himes et al. ................ 361/775
5,067,043 A * 11/1991 Markowski et al. ......... 361/650
5,094,626 A * 3/1992 Fabrizi et al. ............... 439/511
5,126,918 A * 6/1992 Morby et al. ............... 361/644
5,139,426 A * 8/1992 Barkus et al. ................. 439/65
5,196,987 A * 3/1993 Webber et al. ............. 361/624
5,213,518 A * 5/1993 Weidler ...................... 439/211
5,295,042 A * 3/1994 Midgley et al. ............. 361/634
5,343,356 A * 8/1994 Hancock ..................... 361/637
5,486,979 A * 1/1996 Bowen et al. ............... 361/640
5,629,831 A 5/1997 Eggert
5,655,922 A * 8/1997 Dux et al. ................... 439/213
5,658,172 A 8/1997 Schmidt
5,722,862 A 3/1998 Glathe
5,745,338 A * 4/1998 Bartolo et al. .............. 361/637
5,863,219 A * 1/1999 Rischard ..................... 439/532
6,027,380 A 2/2000 Hanning
6,120,315 A 9/2000 Gaertner
6,178,106 B1 * 1/2001 Umemoto et al. ........... 363/146
6,224,429 B1 5/2001 Bernhards
6,229,692 B1 * 5/2001 Stendardo et al. ........... 361/627
6,241,561 B1 6/2001 Zebermann
6,372,989 B1 * 4/2002 Rischard et al. ........... 174/70 B
6,530,811 B1 * 3/2003 Padulo et al. ............... 439/716
6,961,233 B2 * 11/2005 Hoeing et al. ............... 361/622
7,298,606 B2 * 11/2007 M'Sadoques et al. ....... 361/644

* cited by examiner

MOUNTING AND CONNECTING MEANS FOR ELECTRICAL COMPONENTS

BACKGROUND OF THE INVENTION

1. Field of the Invention

A power supply system for supplying electrical power to at least one load includes a base plate, a support rail and a power supply module fastened to the base plate, at least one bus bar module, and a rail mounting device for mounting the bus bar module on the support rail. The rail mounting device includes conductor members for supplying power from the power supply module to bus bars contained within the bus bar modules, respectively.

2. Description of the Related Art

It is well known in the patented prior art to mount electrical power distribution components on support rails, as illustrated, for example, by the U.S. patents to Eggert et al U.S. Pat. No. 5,629,831, Schmidt et al No. 5,658,172, Glathe et al No. 5,722,862, Hanning et al No. 6,027,380, Gaertner et al No. 6,120,315, Bernhards et al No. 6,224,429, and Zebermann et al No. 6,241,561, among others.

When supplying power to certain electrical loads such as a three-phase motor, it is customary to feed the power via a heavy-duty power switch and a circuit breaker, overvoltage relay or the like. It is also desirable to supply single-phase or two-phase power to other electrical appliances. One common drawback to the known power distribution systems is that the connections must normally be performed in a complicated labor-intensive manner, and the systems are relatively complex and inflexible.

Accordingly, the present invention was developed to provide an improved power distribution system that is flexible, and is easily and visually assembled from the front of the electrical panel in a simple plug-in manner without the use of tools. The system is designed to provide single-phase, two-phase and/or three-phase power to electrical loads, such as motors and appliances.

BRIEF SUMMARY OF THE INVENTION

Accordingly, a primary object of the present invention is to provide a power distribution system including a base plate, a plurality of support rails and a power supply module fastened to the base plate, a bus bar module, and rail mounting means for mounting the bus bar module on the support rail and for supplying electrical power to the bus bars of the bus bar module. Plug connector means serve to supply power from the bus bar module to an electrical load, such as a motor, via a heavy-duty power switch and overload circuit breaker means. Alternatively, power may be supplied from the bus bar module directly to a load such as an electrical appliance.

Thus, the advantage is presented that the mounting of the components and the connecting plugs may be quickly achieved in a simple tool-free manner from the front of the electrical panel by movement of the components in a direction normal to the plane of the base plate, thereby affording a great degree of flexibility in the design and assembly of the power distribution system.

According to a more specific object of the invention, the rail mounting means comprises an intermediate mounting device for connecting the adjacent ends of a pair of collinearly-spaced bus bar modules with a single support rail. Alternatively, the rail mounting means comprises a corner device for connecting the adjacent ends of a pair of orthogonally arranged bus bar modules associated with a corresponding pair of orthogonally arranged support rails, respectively. In each case, the rail mounting means contains a plurality of conductive members that connect the phase conductors of the electrical power supply module with corresponding bus bars of the bus bar module. Releasable locking means are provided for fastening the bus bar modules to the rail connecting means, and catch means serve to connect the plugs with the bas bar module.

According to another object of the invention, each of the bas bar modules includes a hollow cover member that contains a plurality of longitudinally extending bus bars, and a synthetic plastic support member that supports the bus bars within the cover member. At their ends, the bus bars include knife contacts that extend downwardly through access slits contained in the top walls of the housing of the rail mounting means for electrical engagement with the power supply conductor members contained therein. Intermediate their ends, the conductors include a plurality of longitudinally spaced upwardly extending contacts that terminate in contact seats adjacent corresponding access slits contained in the upper end wall of the bus bar module. First connector plug means have knife contacts that extend through the access slits of the cover member to connect one of the upper contacts of each of the bus bars with the corresponding input terminals of the power switch module. Second plug means connect the output terminals of the power switch to the input terminals of the circuit breaker, and third plug means connect the output terminals of the circuit breaker to the primary load, such as a motor. Fourth plug means connect two or more of the bus bars of the bus bar modules for supplying single-phase or two-phase power directly to an auxiliary electrical load, such as an appliance.

The invention offers the advantage that the electrical components may be quickly mounted and dismounted in a simple tool-free manner from the front of the electrical panel in a direction normal to the base plate.

BRIEF DESCRIPTION OF THE DRAWINGS

Other objects and advantages of the invention will become apparent from a study of the following specification when viewed in the light of the accompanying drawings, in which.

DETAILED DESCRIPTION OF THE INVENTION

Figure 1:
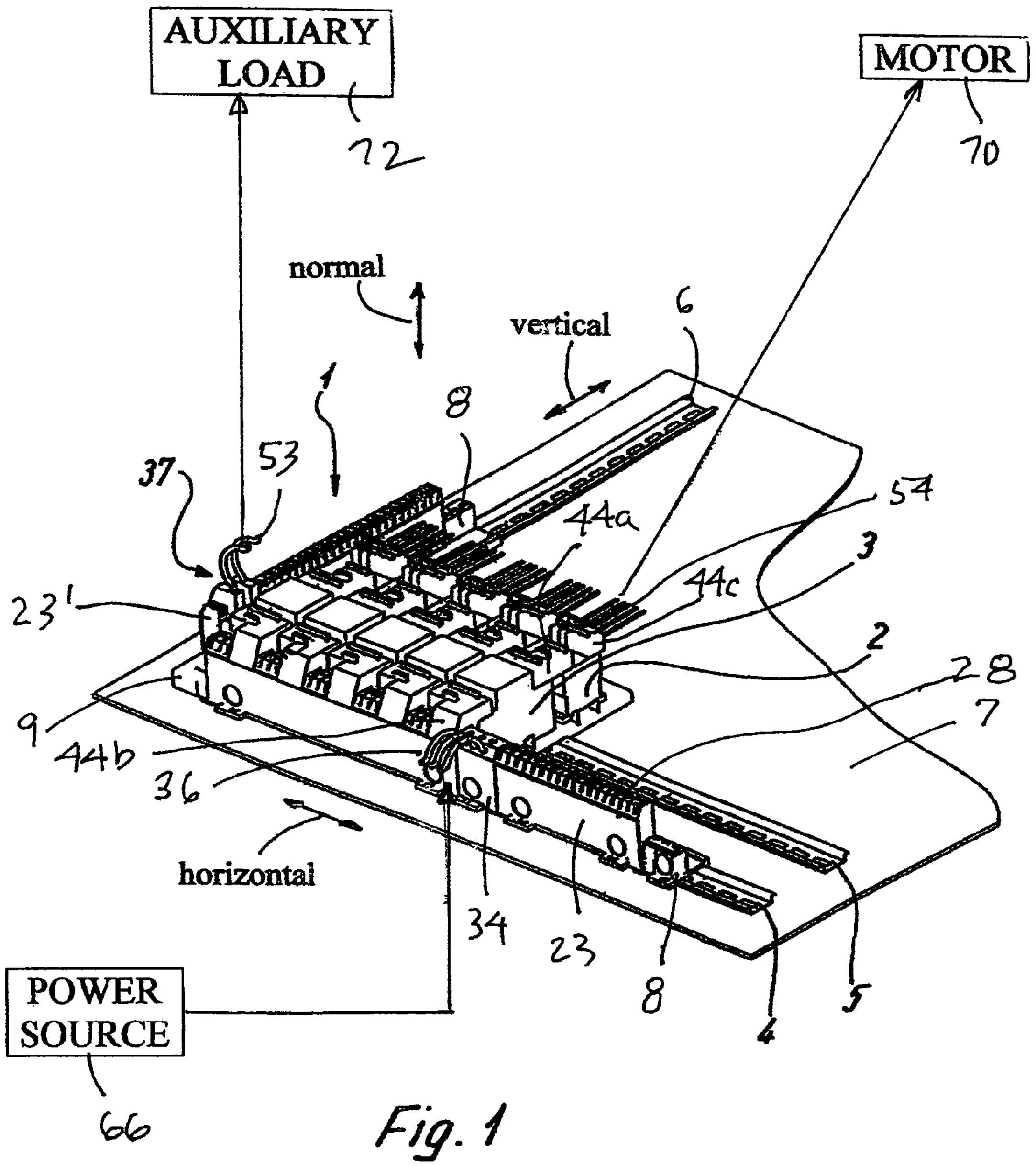
FIG. 1 is a detailed perspective view, with certain parts removed, of the power supply system of the present invention.

Referring first more particularly to FIG. 1, the power suppiy system 1 of the present invention includes a base plate 7 upon which are mounted a pair of parallel spaced horizontal support rails 4 and 5, and an orthogonally extending vertical support rail 6. A plurality of power switch means 3 and a plurality of circuit breaker means 2 are mounted on the base plate 7 by means of a support plate 40. Mounted on the outer support rail 4 are a pair of generally-rectangular longitudinally-spaced bus bar modules 23, and a further bus bar module 23' is mounted on the orthogonally arranged support rail 6. A power supply module 34 is provided intermediate a pair of longitudinally spaced bus modules on the outer support rail 4. As will be explained in greater detail below, the bus bar modules are mounted on the support rail 4 by means of intermediate rail mounting means 8, and the bus bar modules 23 and 23' at the corner of the assembly are supported relative to the base 7 by means of corner rail mounting means 9. As will be explained in greater detail below, three-phase power is supplied from power source 66 to a primary load device, such as a motor 70, via the supply conductors 36, the power supply module 34..a first plug 44*b*, the on-off switch 3, a bridging second plug 44*a*, the overload circuit breaker 2, an outlet third plug 44*c*, and a plurality of outlet conductors 54. Similarly, single-phase power may be supplied to an auxiliary load, such as an appliance 72, from the power source 66 via the conductors 36, the power supply module 34, the corner bus bar module 23, the corner rail mounting means 9, the other corner bus bar module 23', and a pair of auxiliary plugs 37 having output conductors 53.

Figure 2A:
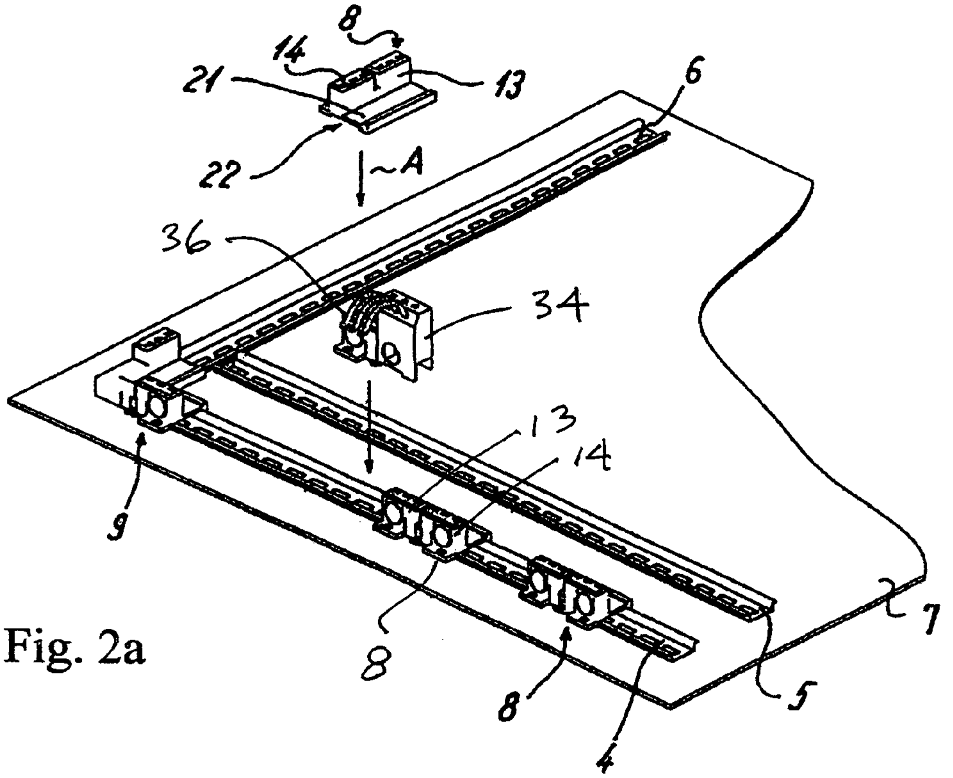
FIGS. 2*a*-6*b* are detailed perspective views illustrating the assembly steps for producing the power supply system of FIG. 1.
Figure 2B:
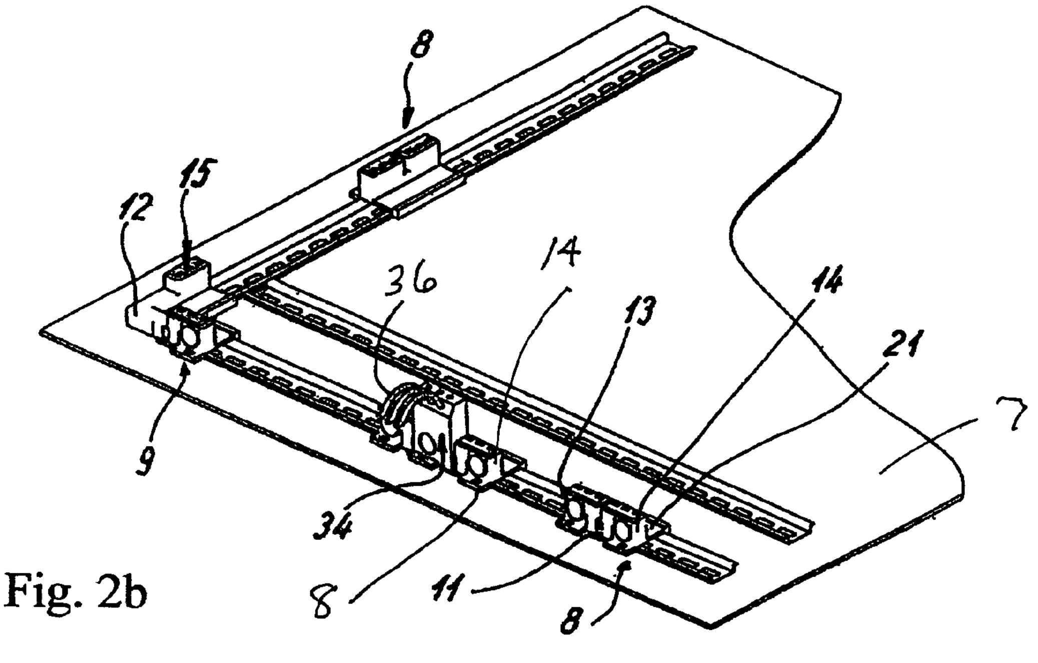

FIGS. 2*a*-6*b* illustrate the various assembly steps for producing the power supply system of FIG. 1. As shown in FIG. 2, the parallel, support rails 4 and 5 and the orthogonally arranged support rail 6 are secured to the base plate 7, whereupon the intermediate rail mounting means 8 are mounted in spaced relation on the rails 4 and 6, respectively, and a corner rail mounting means 9 is mounted on the corner where the adjacent ends of rails 4 and 6 come together. The power supply module 34 is then mounted on the support rail 4, and is secured to the base plate 7 as will be described below.

Figure 3A:
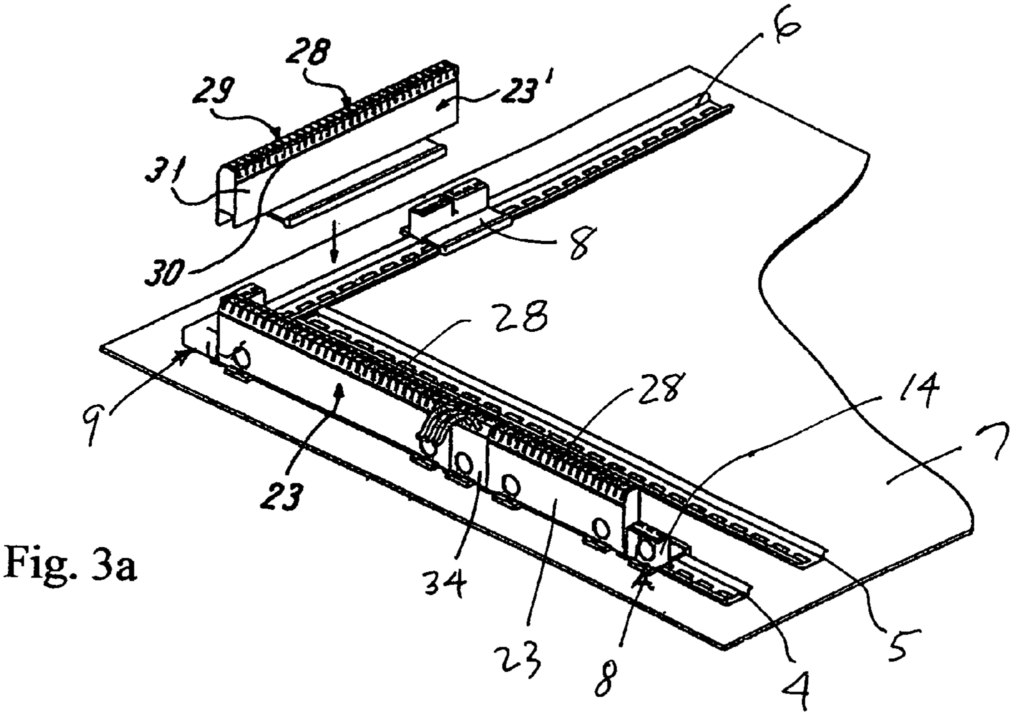
Figure 3B:
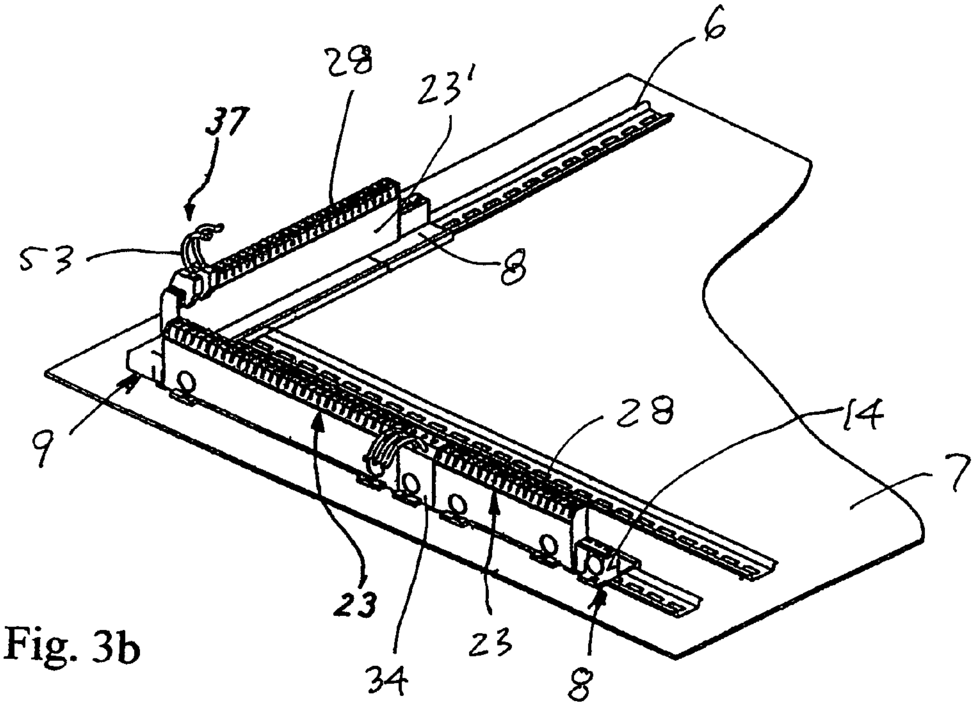

As shown in FIGS. 3*a* and 3*b*, two bus bar modules 23 are mounted on the support rail 4 on opposite sides of the power supply module 34, the remote ends of these bus bar modules being supported by the intermediate rail mounting means 8 and the corner mounting means 9, respectively. At their adjacent ends, the right bus bar module is mounted on the raised pedestal portion 14 of the rail mounting means 8, and the left bus bar module is mounted on a raised pedestal portion 13" (FIG. 13) on the power supply module 34. Similarly, the third bus bar module 23' is mounted on the support rail 6 between the corner rail mounting means 9 and the intermediate rail mounting means 8. A pair of auxiliary plug means 37 are mounted on the bus bar module 23' as shown in FIG. 3*b*.

Figure 4A:
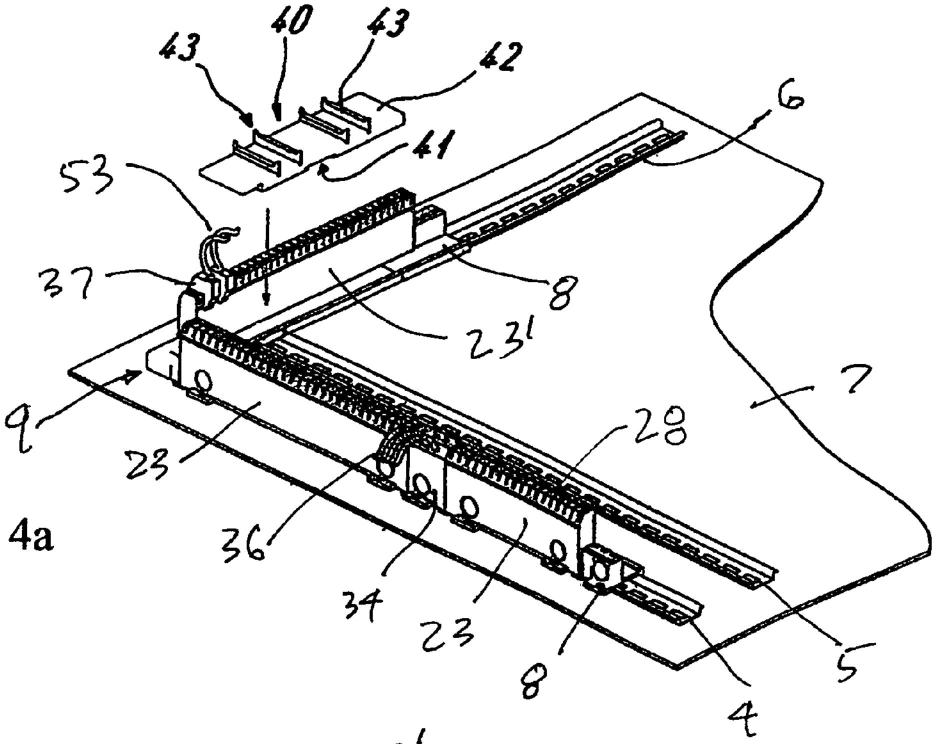
Figure 4B:
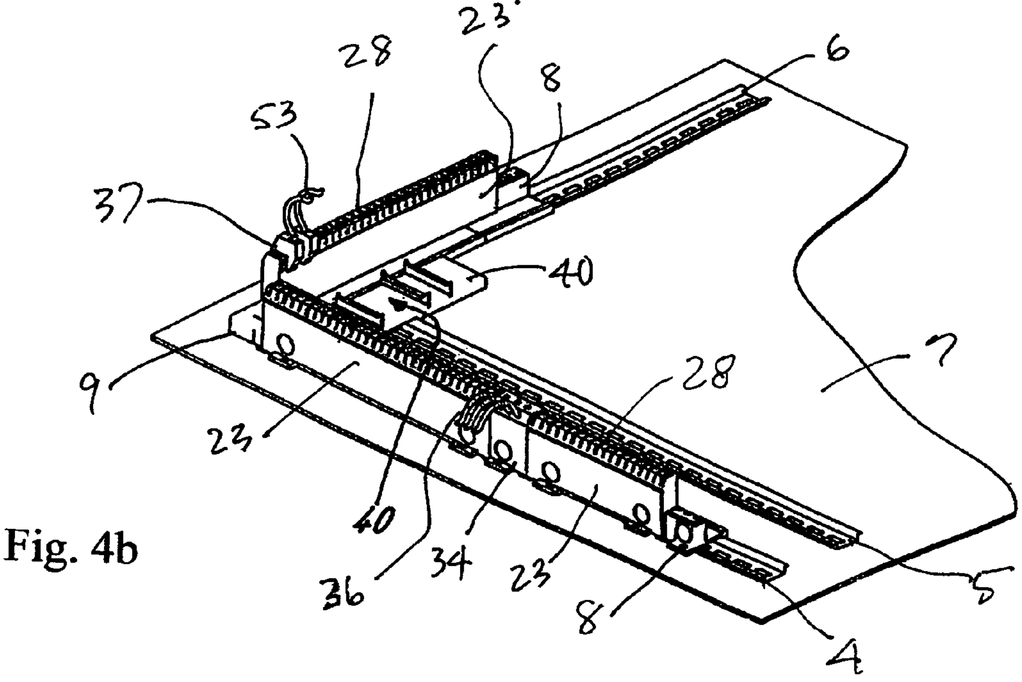
Figure 5A:
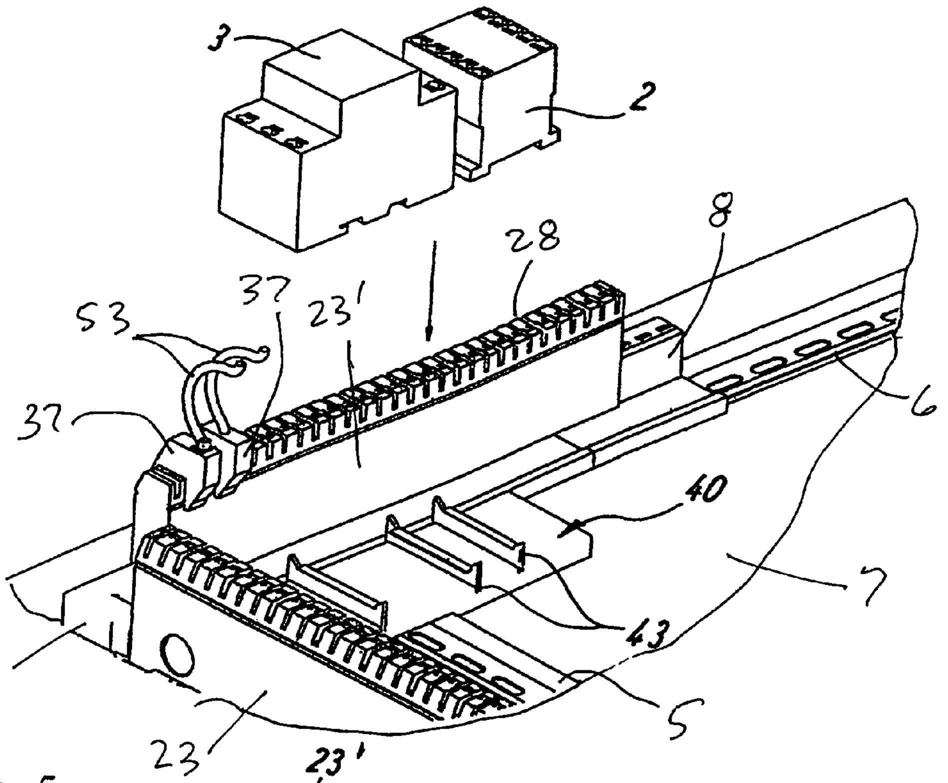
Figure 5B:
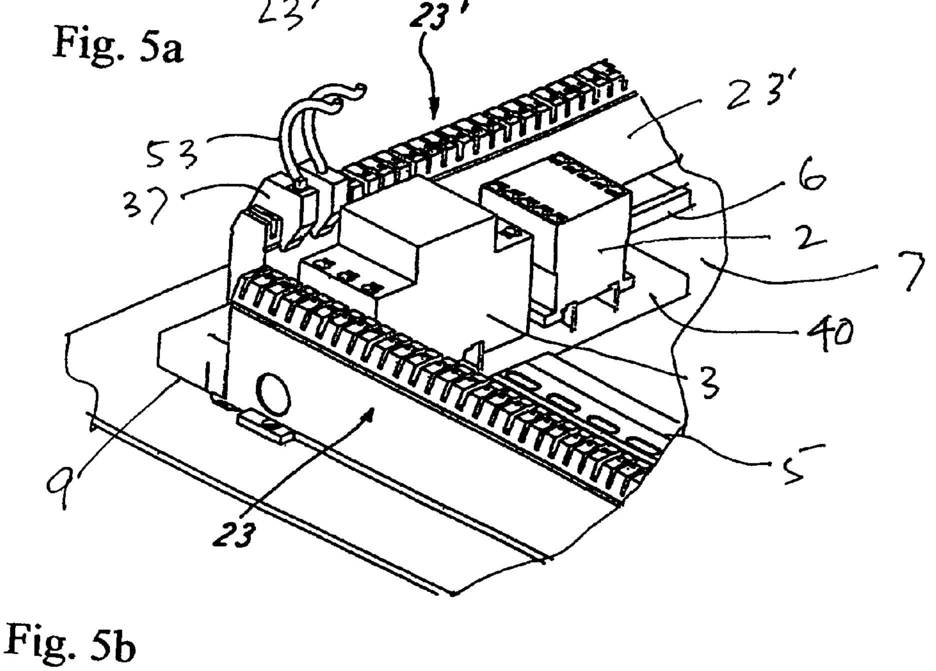

Referring to FIG. 4, mounting plates 40 may be then mounted on the support rail 5 for connection with the base plate 7 by fastening foot means 41 that cooperate with a corresponding support rail. As shown in FIGS. 5*a* and 5*b*, a power switch 3 and a circuit breaker 2 are mounted on the upwardly extending support rib portions 43 of the support plate 40.

As shown in FIG. 6, first plug means 44*b* connect the bus bar contacts of three of the bus bars of the bus bar module 23 with the corresponding input terminals of the on-off power switch 3. Second plug means 44*a* have contacts that extend from the output terminals of the power switch module 3 to the input terminals of the circuit breaker 4. Third plug means 44*c* connect the output terminals of the circuit breaker 2 with the primary load 70 by a third plug means 44*c* having output conductors 54.

Figure 7:
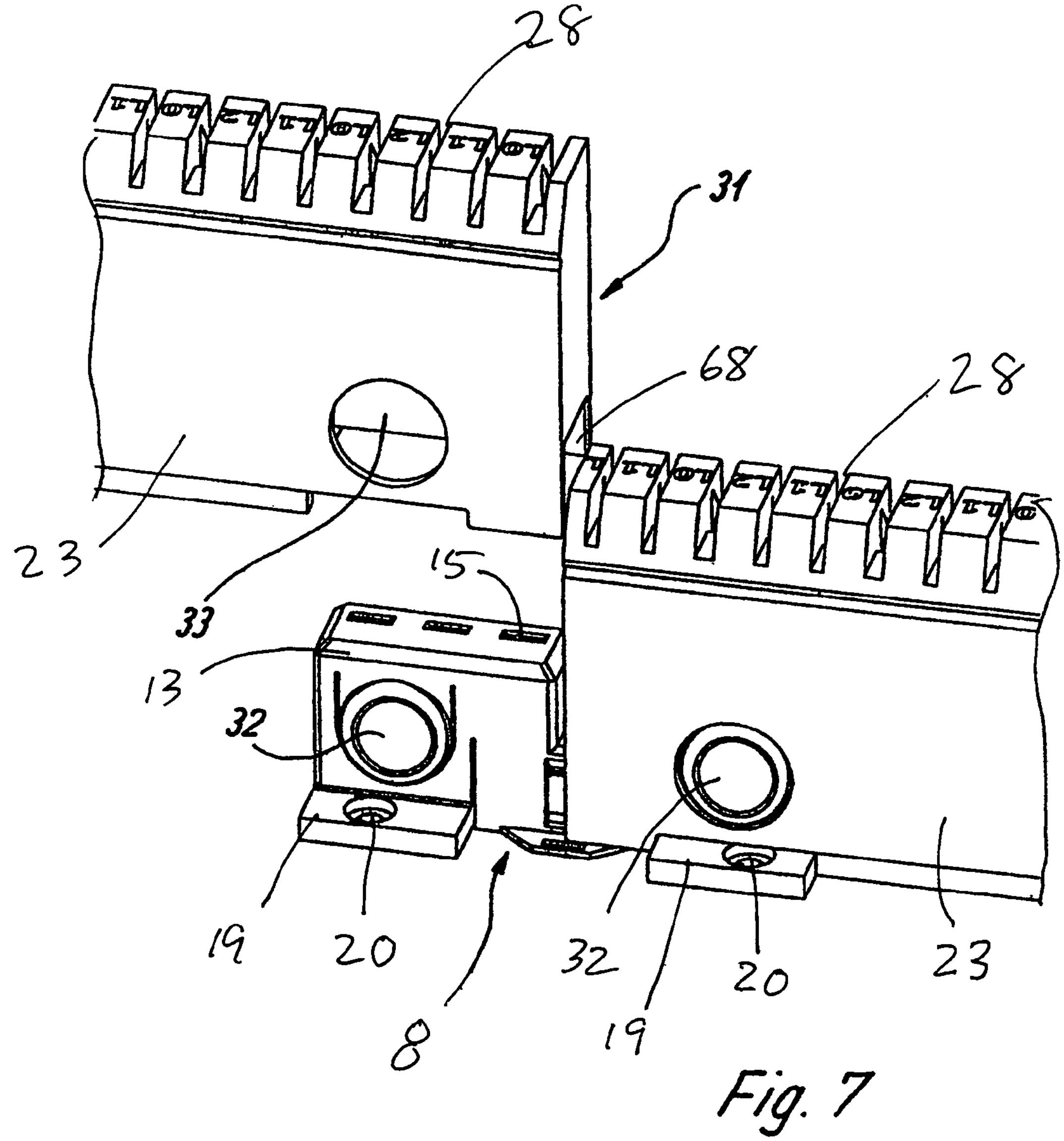
FIG. 7 is a detailed perspective view illustrating the manner of assembly of a pair of bus bar modules to an intermediate rail mounting means.
Figure 8:
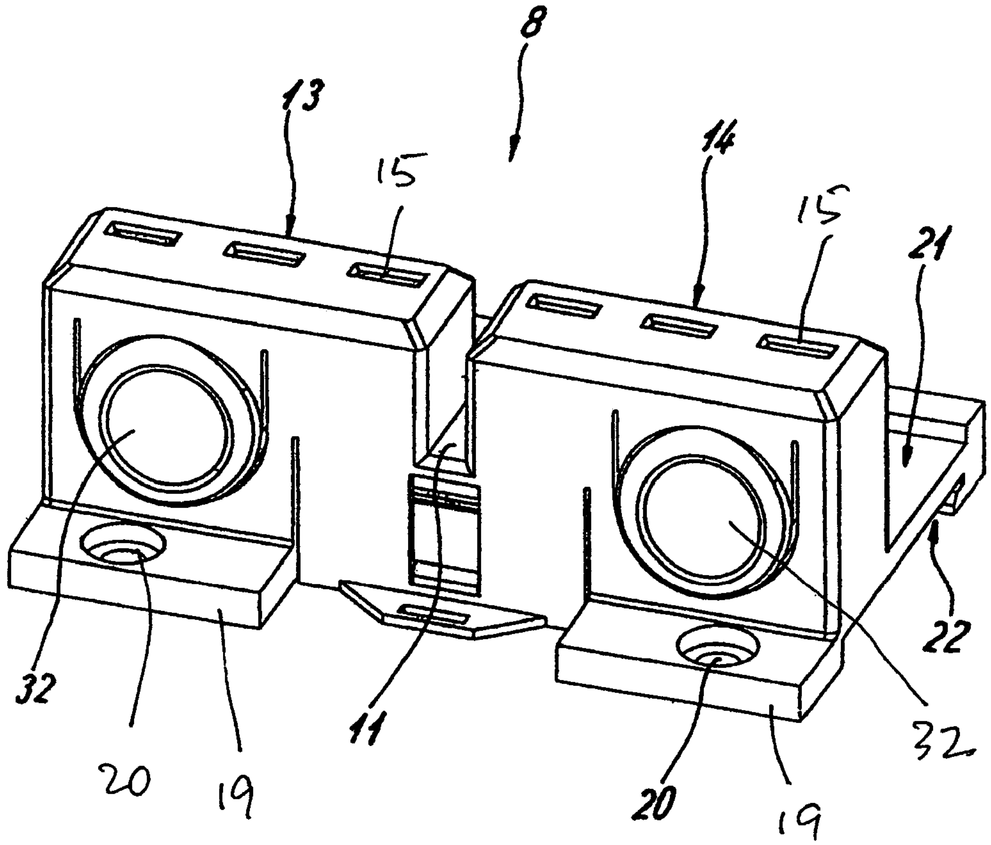
FIG. 8 is a front perspective view to the intermediate rail mounting means of FIG. 7.

Referring now to FIG. 7, the intermediate rail mounting means 8 is operable to mechanically and electrically connect together a pair of adjacent collinearly arranged bus bar modules 23. As shown in FIG. 8, each intermediate rail mounting means 8 includes a pair of raised pedestal portions 13 and 14 that extend upwardly on opposite sides of a middle pedestal portion 11 of smaller height. The adjacent ends of the bus bar modules contain notches 68 for receiving the raised pedestal portions 13 and 14 of the rail mounting means 8, respectively. The intermediate rail connecting means 8 includes a pair of laterally extending mounting lugs 19 containing apertures 20 by means of which the intermediate rail mounting means may be secured to the base plate 7. On its other side, the intermediate rail mounting means 8 includes a rearwardly extending lug 21 having a foot portion 22 adapted to engage the corresponding support rail, whereby the intermediate rail mounting means is securely fastened to the base plate. Each of the raised pedestal portions of the rail mounting means is provided with a resiliently-outwardly-biased locking button 32 that is adapted to extend within a corresponding locking aperture 33 contained in the wall portion of the bus bar module 23, as will be described in greater detail below. The top walls of the hollow housing defining the raised portions 13 and 14 of the intermediate rail mounting means 8 contain a plurality of access slits 15 that extend in the direction parallel with the mounting rail 4.

Figure 9A:
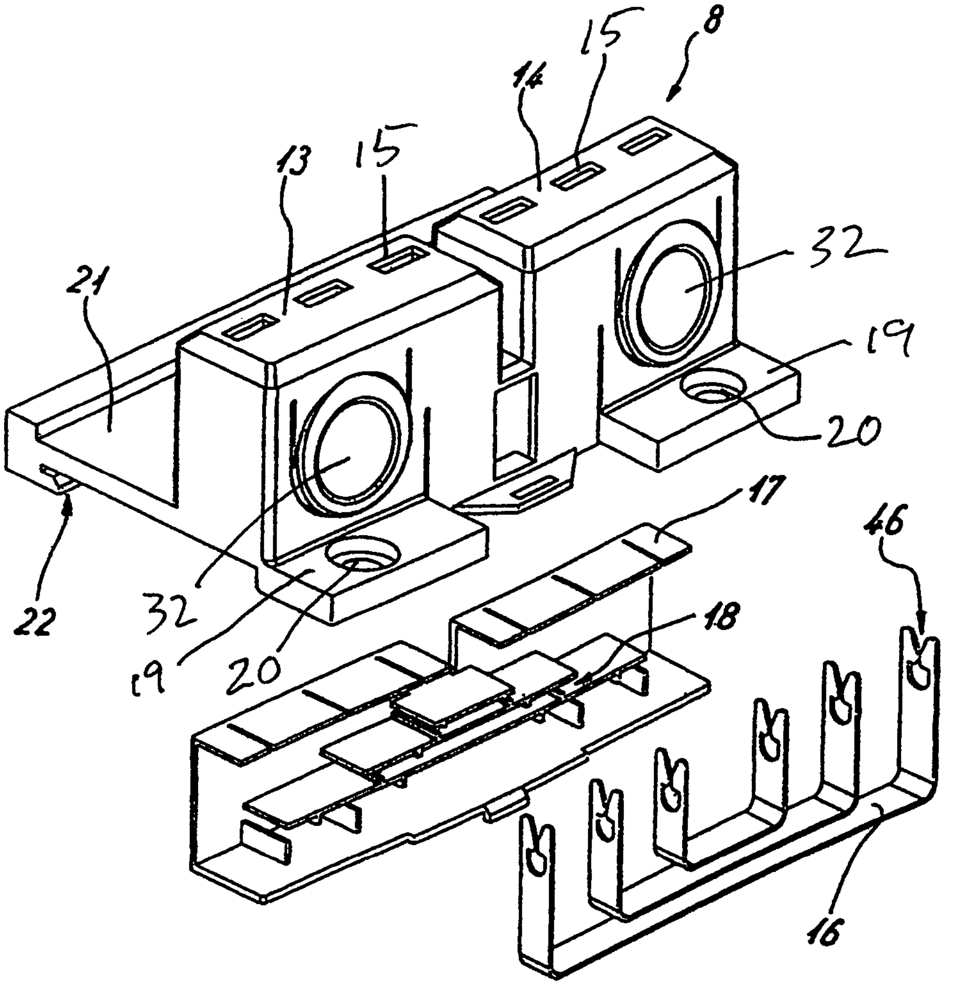
FIG. 9*a* is an exploded view of the intermediate rail mounting means of FIG. 8.

As best shown in FIG. 9*a*, the intermediate rail mounting means 8 includes a hollow housing that contains a plastic support member 17 that supports in space relation a plurality of conductive members 16. More particularly, the synthetic plastic support member 17 is split to define two end portions that extend upwardly within the raised pedestal portions 13 and 14 of the intermediate rail mounting member 8, respectively. As shown in FIG. 9*a*, the U-shaped conductive members 16 have base portions of progressively decreasing size, the U-shaped members being telescopically stacked within one another. At their upper ends, the leg portions of the conductor members 16 terminate at their upper ends in resilient split contact seats 46 that extend adjacent the corresponding access slits 15 contained in the upper top wall of the raised pedestal portions 13 and 14 of the intermediate rail mounting means 8. Thus. the three conductor members provide adjacent the access slits 15 six contact seats 46 by means of which three-phase power is provided.

Figure 9B:
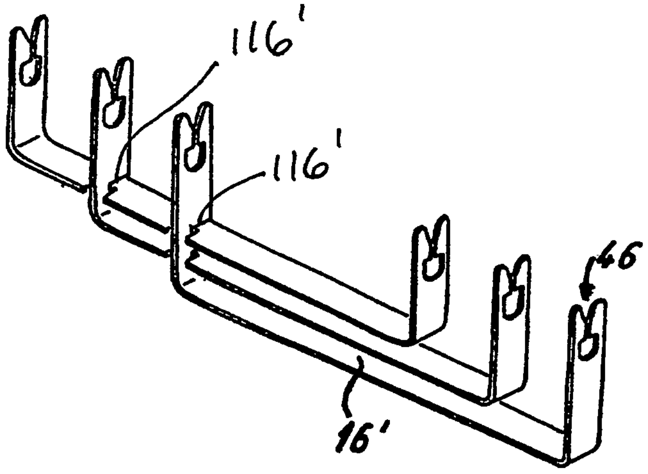
FIG. 9*b* is a perspective view of another embodiment of the conductive member arrangement of FIG. 9*a;*

In the modification of FIG. 9*b*, the U-shaped conductive members 16' are arranged in longitudinally displaced relation, the base portions of some of the conductor members extending through corresponding insulated slots 116*a*' contained in the vertical leg portions of the U-shaped conductor members 16'.

Figure 10:
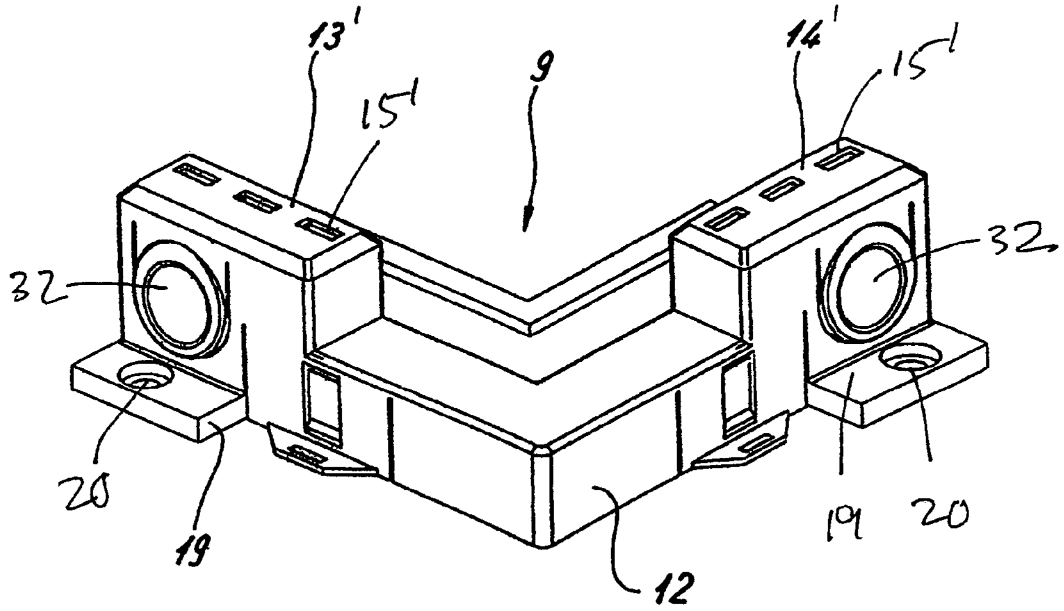
FIG. 10 is a front perspective view of the corner rail mounting means of FIG. 1.
Figure 11A:
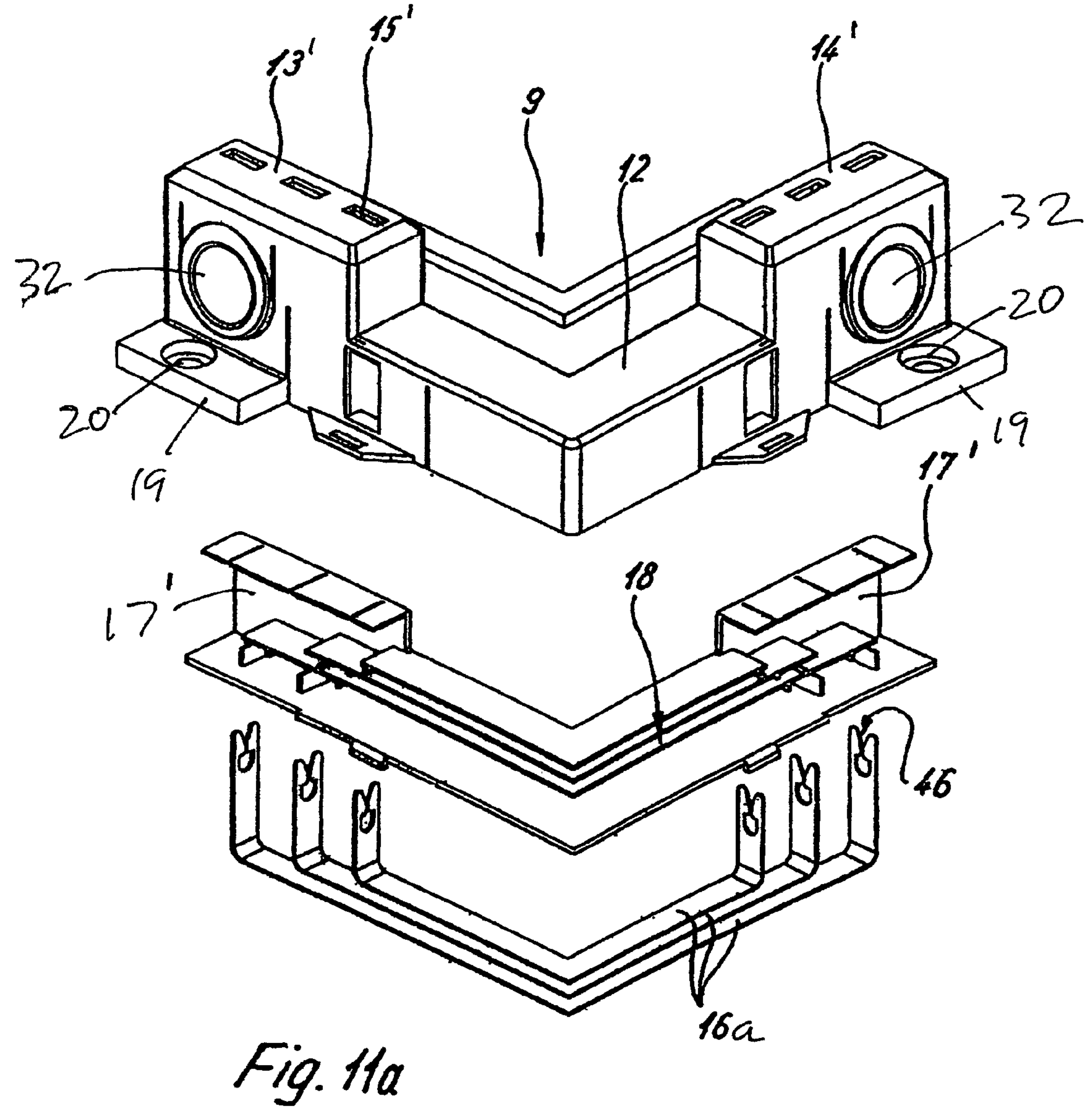
FIG. 11*a* is an exploded perspective view of the corner rail mounting means of FIG. 10.
Figure 11B:
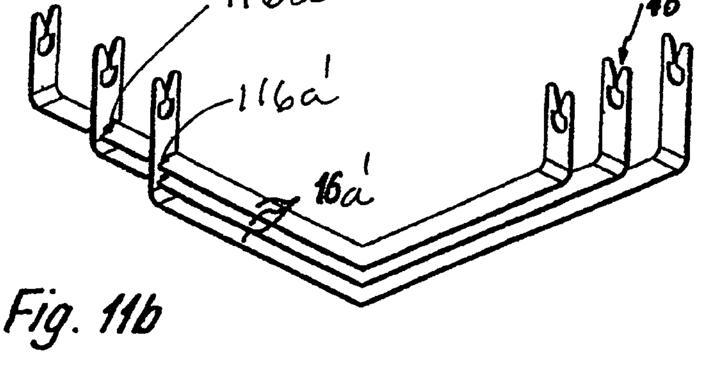
FIG. 11*b* is a perspective view of another embodiment of the conductive member arrangement of FIG. 11*a;*

Referring now to FIG. 10, it will be seen that the corner rail mounting means 9 includes a pair of raised portions 13' and 14' that are angularly arranged and are connected by the corner intermediate angled portion 12. As before, the corner rail mounting means 9 are provided with laterally extending mounting feet 19 containing openings 20 by means of which the corner rail mounting means is rigidly fastened to the base plate 7. As best shown in FIG. 11*a*, the corner rail mounting means 9 includes a hollow housing the raised portions 13' and 14' of which receive the corresponding upwardly extending end portions of the synthetic plastic support plate 17'. In this embodiment, the base portions of the U-shape conductive members 16*a* are angularly bent at their centers, thereby to define angularly arranged bent sections that carry the upwardly extending leg portions which terminate at their free upper ends in resilient split contact seats 46 adjacent the access slits 15' contained in the top walls of the raised portions 13' and 14', respectively. As shown in FIG. 11*a*, the upper extremities of the contact seats 46 defined at the upper ends of the upwardly extending leg portions of the connecting members terminate in a common plane of this parallel with the base plate 7. In the modification of FIG. 11*b*, the base sections of some of the bent conductor members 16*a'* extend through corresponding insulated slots 116*a'* contained in the leg portions associated with the raised pedestal portion 13'.

Figure 12:
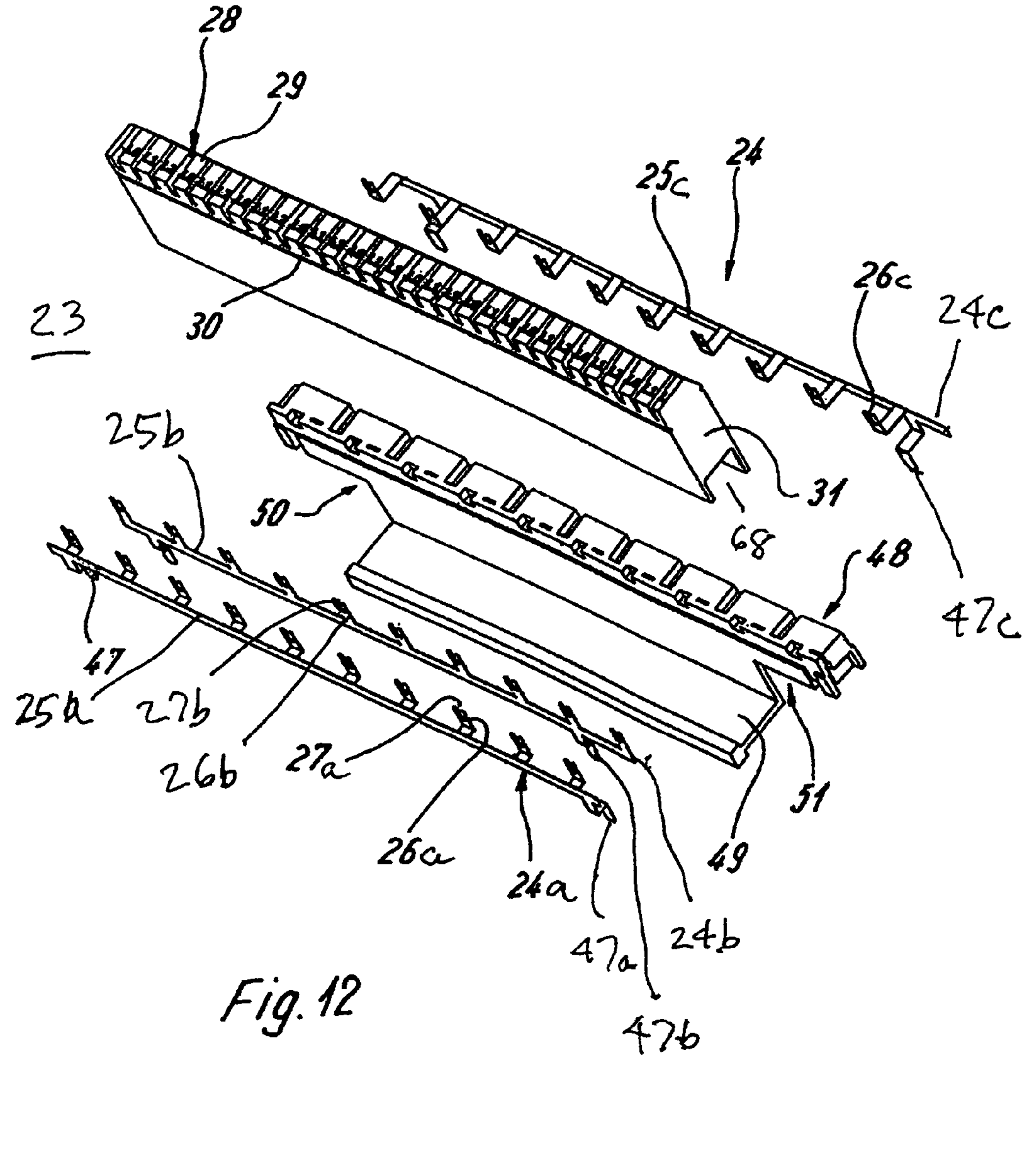
FIG. 12 is an exploded perspective view of one of the bus bar modules of FIG. 1.

Referring now to FIG. 12, the bus bar module 23 includes a hollow cover member 31 that receives in longitudinally arranged laterally spaced relation a plurality of bus bars 24*a*, 24*b*, and 24*c*. The bus bars are supported in spaced relation within the cover member 31 by a synthetic plastic support member 48 that contains recesses 50 and 51 at the opposite ends thereof. As will be explained in greater detail below, these recesses that define the notches 68 receive the raised pedestal portions of the rail mounting means 8 and 9 during the mounting of the bus bar module to the support rails 4 and 5. Also, the synthetic plastic support member 48 is provided with a lateral support extension 49 that serves to stabilize the bus bar module on the base plate 7. The bus bars 24 include a conductor bar portion 25 having at its ends downwardly projecting knife contacts 47 that are arranged to extend through the corresponding slots 15 contained in the raised pedestal portion of the associated rail mounting device. Similarly, the bus bars have upwardly extending contacts 26 that terminate in resilient split plug seats 27 that terminate adjacent the under surface of the top wall portion 29 of the cover member 31 adjacent respective cover access slits 28 contained therein. The upper and lower contacts 26 and 47 on the three bus bars 24*a*, 24*b*, and 24*c* are staggered, so that for three successive access slits 28 in the cover member 31, the resilient plug seats 27 of three different bus bars extend therebeneath.

Figure 13:
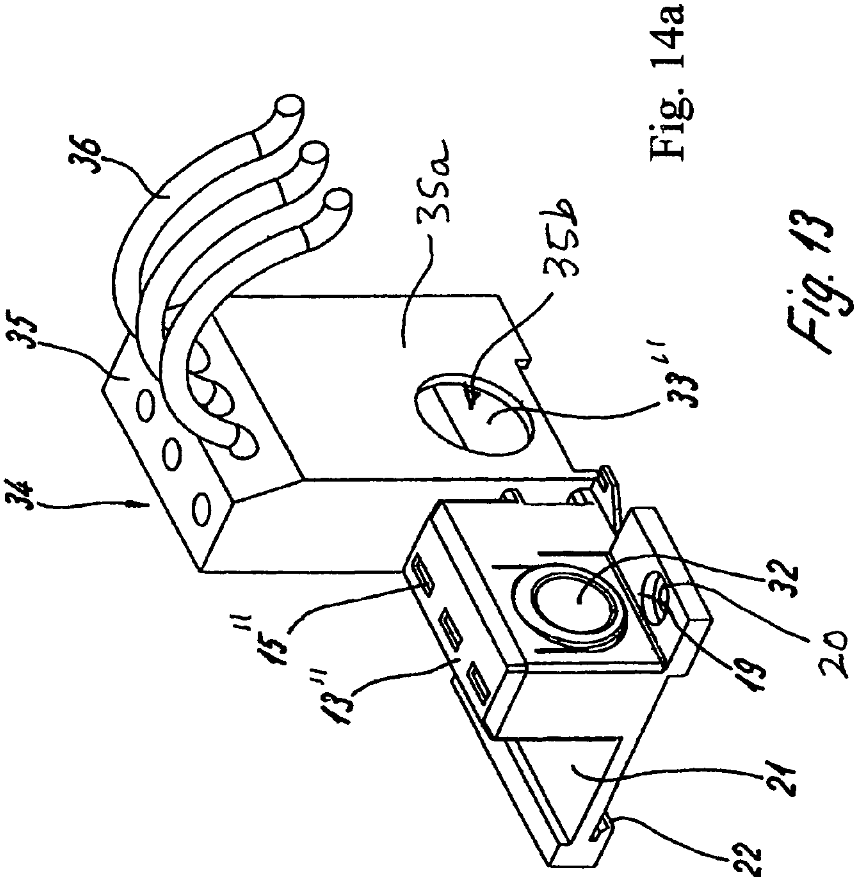
FIG. 13 is a front perspective view of the power supply module of FIG. 1.

Referring now to FIG. 13, the power supply module 34 includes a hollow housing 35 having a raised pedestal portion 13" that corresponds with the raised pedestal portions of the rail mounting means 8 and 9. The top wall of the raised pedestal portion 13" contains three access slits 15" for receiving the downwardly extending contacts 47 of the associated bus bar means 24*a*, 24*b*, and 24*c*, respectively. The power supply module 34 is provided with a mounting foot portion 19 containing an openine 20 for fastening the power supply module to the base plate 7. Furthennore, the module includes a horizontal mounting plate 21 having a mounting foot 22 adapted to cooperate with the associated support rail to securely fasten the power supply module to the plate 7. On its front wall the raised pedestal portion 13" is provided with a locking projection 32" that is rcsiliently biased outwardly for engagement within a corresponding aperture contained in the lower portion of the cover member 31 of the adjacent bus bar module, as shown in FIG. 7. The chamber 35*b* defined within the enlarged housing portion 35 is adapted to receive a raised pedestal portion 13 from the associated rail mounting means. The three electrical conductors 36 supply electrical power to three conductor members contained within the power supply module corresponding with the three conductors of either FIG. 9*a* or FIG. 9*b*. The locking projection 32 of the rail mounting means extends through the locking aperture 33" contained in the front wall of the enlarged portion 35*a* of the power supply module 34.

Figure 6A:
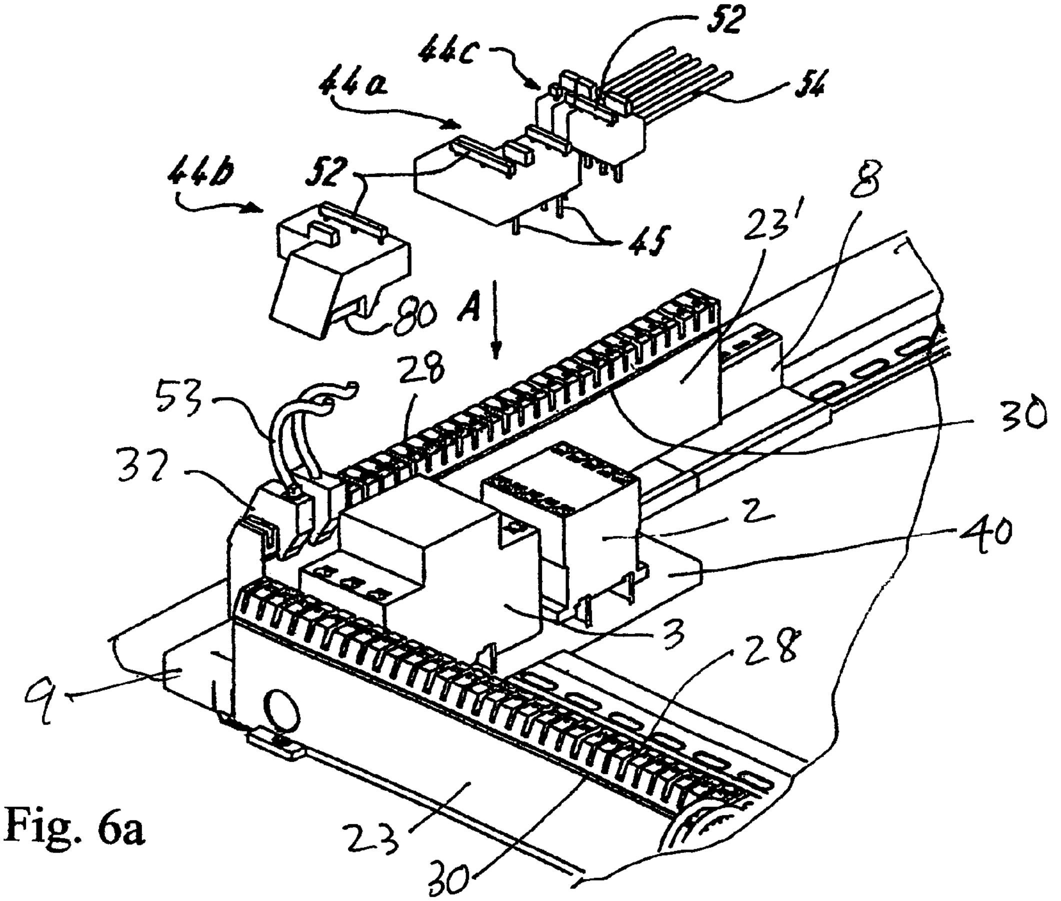
Figure 6B:
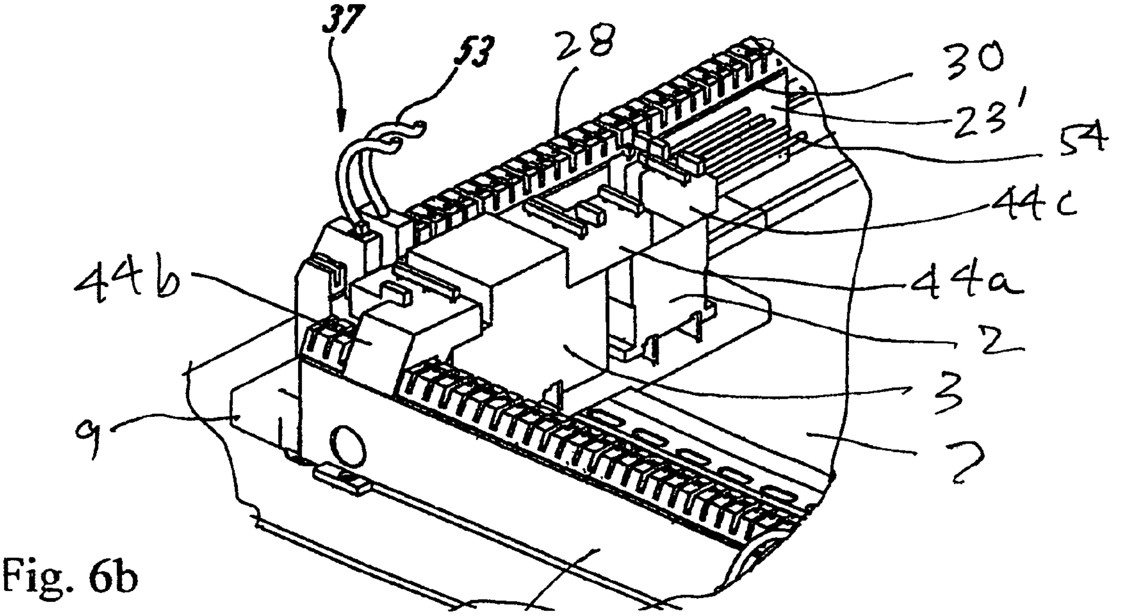
Figure 14A:
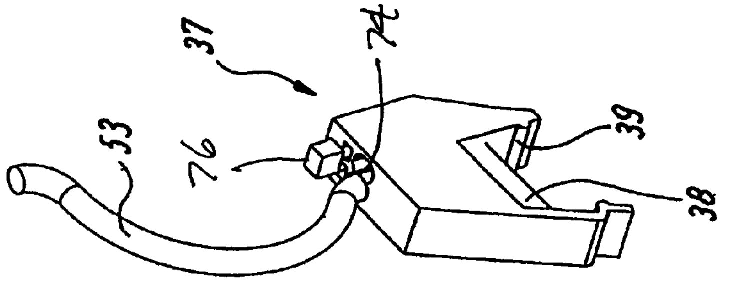
FIG. 14*a* is a perspective view of one of the auxiliary plugs of FIG. 1.
Figure 14B:
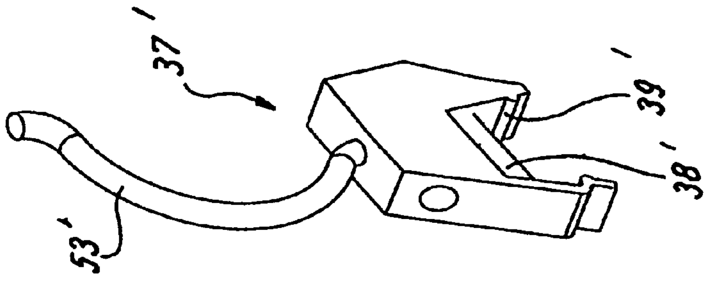
FIG. 14*b* illustrates a modification of the auxiliary plug of FIG. 14*a;*

Referring now to FIG. 14 *a* , the auxiliary plug 37 contains at its lower end a recess proVided with a knife contact 38. When the auxiliary plug is mounted on the bus bar module 23' as shown in FIG. 1, the knife contact 38 extends within one of the access slits 28 provided in the upper wall of the bus bar module 23, thereby to effect engagement between the knife contact 38 and the associated bus bar contact seat 27. A catch rib 39 engages a corresponding catch groove 30 (FIG. 12) contained in the cover member 31 of the associated bus bar module 23'. The knife contact 38 is connected with the output conductor 53. whereby when a pair of the auxiliary plugs 37 are mounted on the bus bar 23' as shown in FIG. 6*a*, the knife contacts of the auxiliary plugs 37*a* extend through the access slits 28 contained in the cover member 31 into engagement with the associated resilient bus bar contacts 27 of the corresponding bus bar contained in the bus bar module 23". The knife edgc of the second auxiliary contact 37*b* engages the resilient contact seat of another bus bar, whereby two-phase electrical power is supplied to the associated auxiliary load 72, such as an appliance or the like. The catch ribs 39 on the auxiliary plugs 37 engage corresponding mounting grooves 30 provided on the cover member 31 of the bus bar module, as best shown in FIGS. 6 and 12. In the auxiliary plug of FIG. 14*a*, screw means 74 are provided that afford a tap off voltage terminal, and indicator lights 76 is provided for indicating thc status of the plug.

Referring now more particularly to FIGS. 6*a* and 7, the first power supply plugs 44*b* have three longitudinally-spaced knife edges 80 that extend through three successive slots 28 contained in the upper wall portion 29 of the housing 31 of the bus bar module, which knife edges are brought into electrical contact into electrical engagement with the staggered resilient split contact seats 26*a*, 26*b*, 26*c*, respectively. In this manner, three-phase electrical power is supplied to the motor 70 via the switch 3 and circuit breaker 2.

The first plug further includes a locking rib that is adapted to engage the corresponding groove 30 contained in the outer surface of the cover member 31 of the bus bar module 23.

Figure 15:
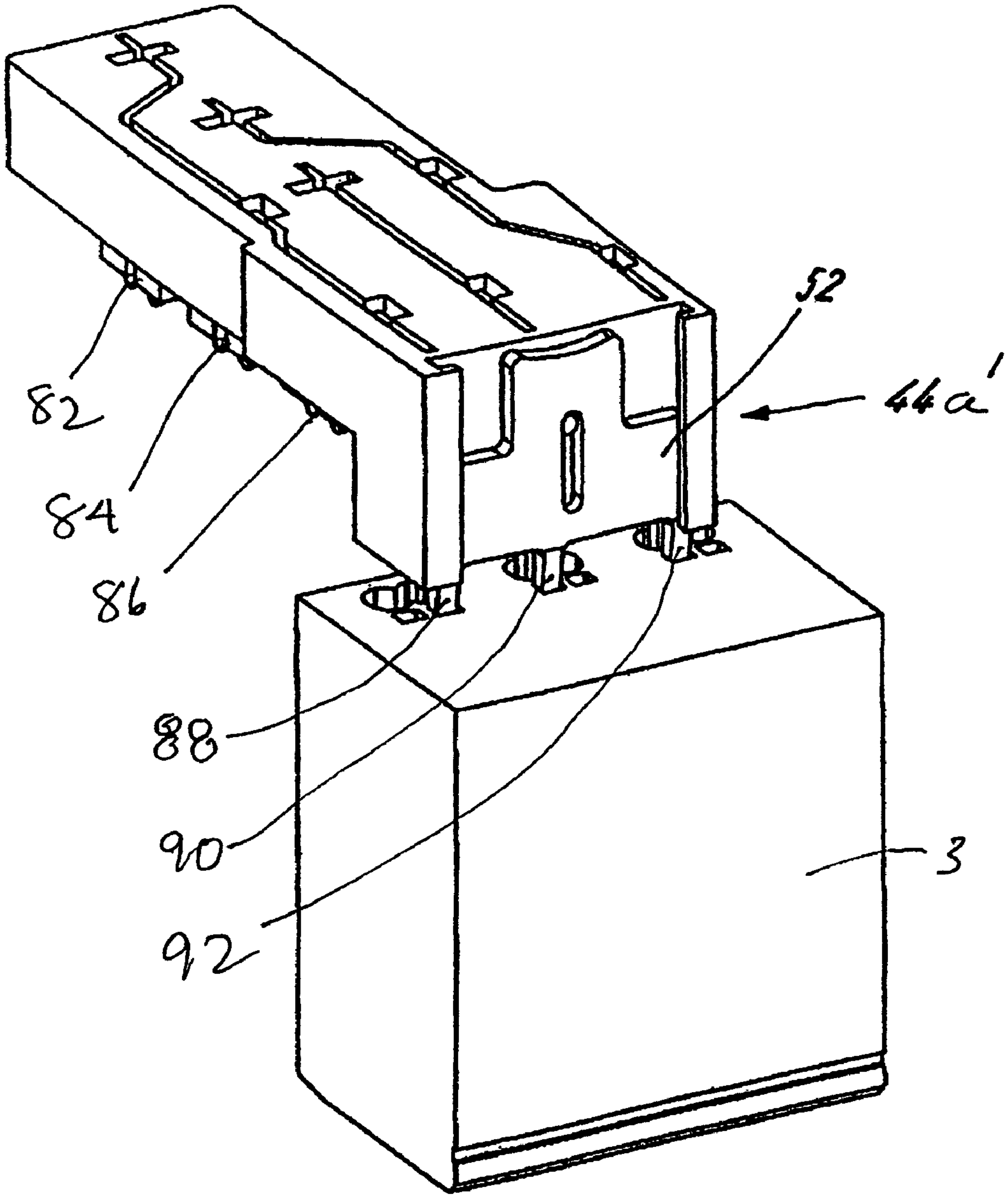
FIG. 15 is a perspective view of a another embodiment of the first plug means of FIG. 6.
Figure 16:
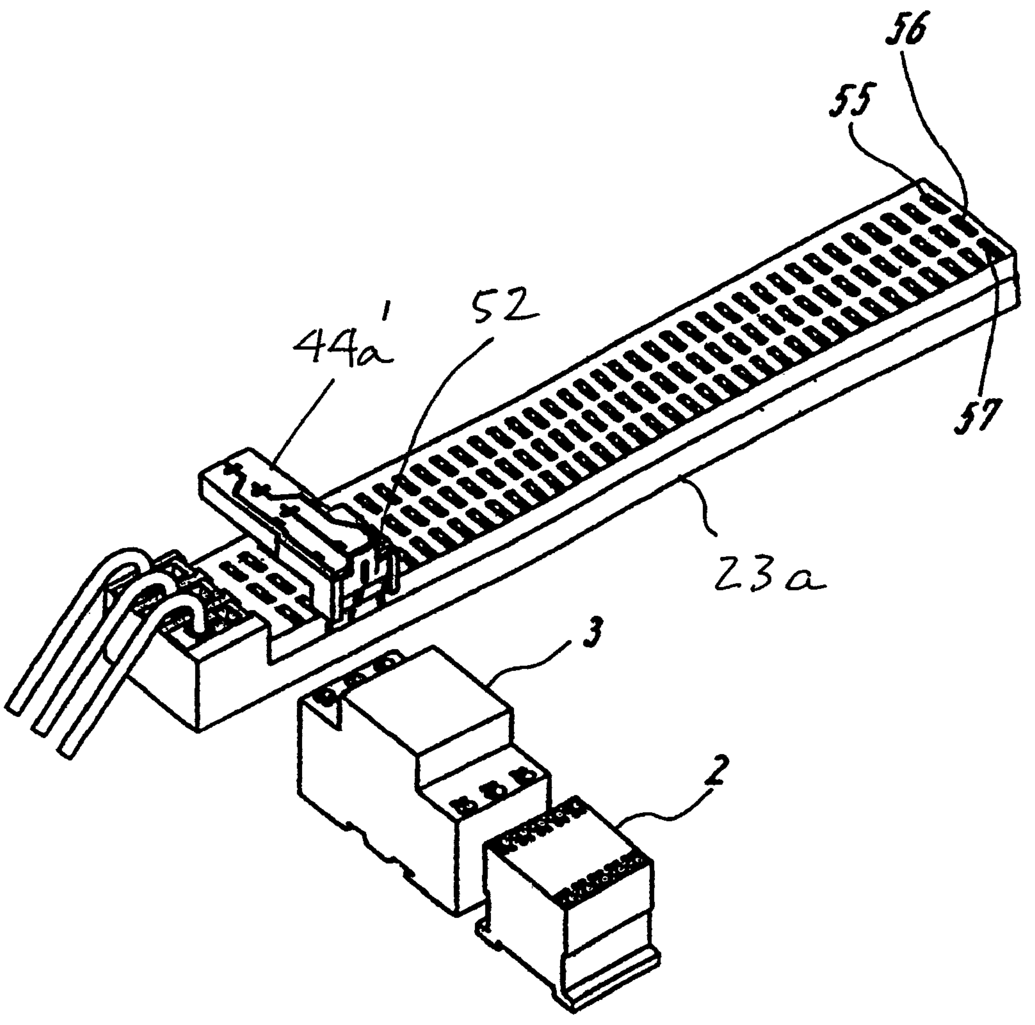
FIG. 16 illustrates another embodiment of a power supply module using the plug means of FIG. 15.

Referring now to FIGS. 15 and 16, according to a modification of the invention, the access slits 55, 56, and 57 of the bus bar module 23 are arranged in rows, rather than in the single line arrangement of FIG. 12. In this regard, the first plug 44*a'* includes three laterally knife contacts 82, 84, and 86 for engaging the corresponding bus bar contacts via the access openings 55, 56, and 57, respectively. The output terminals 88, 90, and 92 from the plug 44*a'* extend within corresponding input terminals of the heavy duty switch means 3. As is known in the art, locking means 52 that are slideably mounted on the plug 44*a'* serve to lock the plug to the switch module 3. Similar locking means 52 may be provided on the plugs 44*a*, 44*b*, and 44*c*, of FIG. 6.

With regard to the bus bar arrangements and the connectors, it should also be noted that they can be designed to provide three-phase service, as shown here. As an alternative, however, one can also think in terms of a design for a connection of single-phase appliances or for two phases or for three phases plus zero conductors. The number of bus bars and connections will be adapted to the particular design. It is also conceivable that one might provide an additional control voltage supply. In a less preferred embodiment it is also conceivable that one might arrange the connections for the various phases and/or the bus bars of the bus bar arrangement, not in a row, one behind the other, but next to each other in several rows, 55, 56, 57 (see FIG. 16). The connectors and the power supply module are designed accordingly.

The cooperation between the power supply module 34, the connectors 8, 9, and the bus bar arrangement 23, creates a bus bar structure for voltage supply of electrical appliances, which structure can be assembled and disassembled in a simple manner, which can be expanded and used in any desirable fashion almost in which, in the process, has a recognizable structuring pattern.

In particular, one can make a bus bar structure "diagonally" on the two supporting rails 4, 6 from which one can easily reach any place in the additional supporting rails arranged in the corner rails, in this case, by way of example, only a single supporting rail 5.

According to an advantageous variant, the mounting plates 40 are locked upon the bus bar or bars 5, inside the corner area that is established by the outer bus bars 4, 6, which plates on their underside, toward the bus bar 5 have catch foot areas 41 for the purpose of locking upon the support rail plus a plate area rail 42 on which additional catch contours 43 are arranged (FIGS. 4*a* and *b*).

The surface of the mounting plate pieces 40, in this example, is so dimensioned and the catch contours 43 are so designed that, in each case, one of the contactors 2 and one of the power switches 3 can be locked on. This is illustrated in FIGS. 5*a* and *b*. In that way, one can guarantee a defined interval of the motor triggering components, something that results in a particularly uniform and clear structure.

The mounting plate pieces end flush toward each other so that the connectors and the bus bars and the mounting plates will form an optically clean, continuing mounting base surface.

The surface of the mounting plate 40, in this example, is so dimensioned and the catch contours 43 are so designed that, in each case, one of the circuit breakers 2 and one of the power switches 3 can be locked thereon. This is illustrated in FIGS. 5 *a* and *b* . In that way, one can guarantee a defined interval of the motor triggering components, something that results in a particularly uniform and clear structure.

Preferably, all connections are made as direct plug-in connections (push-in) which can be operated without any tools. In this way, one can implement a particularly fast production of all connections. Otherwise, one preferably uses a lock-on system for the mounting of the components and almost inclusively or even entirely inclusively, one must perform uniform mounting and connecting plug movements orthogonally from the front to the supporting rails. Therefore, the assembly is to be considered as particularly simple and the function can be performed in a fast simple fashion.

The bus bar arrangements can have the most varied grid patterns (in particular, 9 mm, 18 mm, 27 mm . . . n*9 mm).

Using auxiliary plugs 37, one can, in a simple manner, attach, upon the bus bar arrangements, additional plug-in outlets, using any desired connecting technique, for example, the direct plug-in technique, or a screw technique.

In summary, the structural elements of the system described above can provide the following advantages. By use of the present invention, every point on a mounting plate, with supporting rails, can be provided with a power supply voltage in a simple manner. The power supply point can be freely selected. As an alternative, the rail mounting connector, corner connector, and power supply module, can also be attached directly upon the mounting plate 7. When supporting rails are used, the entire system can be mounted in advance and can then be aligned upon the mounting plate. In this way, one can make all components "finger-safe" also in the "pulled" state. In place of the corner connector, one might also make a T-piece with a terminal cap. The system can be expanded in a simple manner.

While in accordance with the provisions of the Patent Statutes the preferred forms and embodiments of the invention have been illustrated and described, it will be apparent to those skilled in the art that various changes may be made without deviating from the inventive concepts set forth above.

What is claimed is:

1. A power supply system for supplying electrical power to a load, comprising:

(a) a base plate (7);

(b) linear support rail means (4, 5, 6) mounted on said base plate;

(c) a plurality of generally-rectangular bus bar modules (23, 23') each having a longitudinal axis and a pair of opposite ends;

(d) a power supply module (34);

(e) a plurality of rail mounting means (8, 9) mounting said power supply module and said bus bar modules in electrically connected relation on said support rail means, said bus bar modules extending longitudinally of the associated support rail means;

(f) a power switch module (3) having input and output terminals;

(g) a circuit breaker module (2) having input and output terminals;

(h) mounting means (40) for mounting said power switch module and said circuit breaker module on said base plate;

(i) first plug means (44*b*) connecting said bus bar module with said power switch input terminals;

(j) second plug means (44*a*) connecting said power switch output terminals with said circuit breaker input terminals; and (k) third plug means (44*c*) operable to connect said circuit breaker output terminals with the load, respectively.

2. A power supply system as defined in claim 1, wherein said first, second and third plug means are arranged on opposite sides of said power switch and circuit breaker modules from said base plate, each of said first, second and third plug means being displaceable in a direction normal to said base plate between plugged and unplugged conditions relative to the associated power switch and circuit breaker modules.

3. A power supply system as defined in claim 1, wherein said support rail means includes two linear support rails (4,6) orthogonally arranged to define a corner; wherein two of said bus bar modules are orthogonally arranged in spaced end-to-end relation parallel with said orthogonally arranged rails adjacent said corner, respectively; and further wherein one of said rail mounting means comprises a corner rail mounting means (9) for mounting the adjacent ends of said two bus bar modules on the associated support rails, respectively, and far electrically connecting together said two bus bar modules.

4. A power supply system as defined in claim 1, wherein two of said bus bar modules are arranged in collinearly spaced end-to-end relation parallel with a given rail, and further wherein said rail mounting means includes an intermediate rail mounting means (8) for mounting the adjacent ends of said two bus bar means on said given rail and for electrically connecting together said two bus bar modules.

5. A power supply system for supplying electrical power to a load, comprising:

(a) a base plate (7);

(b) linear support rail means (4, 5, 6) mounted on said base plate:

(c) a plurality of generally-rectangular bus bar modules (23, 23') each having a longitudinal axis and a pair of opposite ends;

(d) a power supply module (34); and (e) a plurality of rail mounting means (8, 9) mounting said power supply module and said bus bar modules in electrically connected relation on said support rail means, said bus bar modules extending longitudinally of the associated support rail means: wherein each of said rail mounting means includes;

(1) a hollow housing having a pair of raised pedestal end portions (13, 14; 13', 14') of a given height relative to said base plate; and (2) a bridging portion (11) having a smaller height than said raised pedestal end portions, said raised pedestal end portions having top wall portions parallel with said base plate;

(3) a plurality of spaced generally U-shaped conductive members (16) each having a pair of leg portions that extend in a direction normal to said base plate into said raised pedestal end portions, respectively, and a base portion connecting said leg portions and extending parallel with said base plate, each of said leg portions terminating at its free end in a resilient split contact seat (46) adjacent the top wall portion of the associated raised pedestal portion of said hollow housing; and (4) synthetic plastic support means (17) supporting said U-shaped conductive members in said hollow housing;

(5) said pedestal top wall portions containing a plurality of housing access slits (15) opposite said contact seats, respectively.

6. A power supply system as defined in claim 5, wherein each of said bus bar modules comprises:

(1) a hollow cover member (31) having a pair of parallel spaced wall portions that extend across said notches at the ends of said bus bar module;

(2) a plurality of bus bar members (24) arranged longitudinally within said hollow cover member parallel with said base plate; and (3) a synthetic plastic bus bar support member (48) supporting said bus bar members within said hollow cover members;

(4) said bus bar module hollow cover member and said synthetic plastic bus bar support member containing at their remote ends notches (51, 68) for receiving the associated said rail mounting means raised pedestal portions.

7. A power supply system as defined in claim 6, and further including releasable locking means (32,33) for locking each of said bus bar modules to the associated rail mounting means.

8. A power supply system as defined in claim 7, wherein said releasable locking means includes a locking member (32) that is resiliently biased outwardly from said rail mounting means toward locking engagement with a corresponding locking opening (33) contained in said bus bar module hollow cover member.

9. A power supply system as defined in claim 6, wherein each of said bus bar modules further includes:

(5) a top wall (29) on said hollow cover member parallel with said base plate, said top wall containing a plurality of longitudinally spaced cover access slits (28);

(6) each of said bus bar members including:

(a) a plurality of upper longitudinally-spaced resilient split contacts (26) directed normal to said base plate and terminating at their free ends in contact seats (27) adjacent said cover access slits, respectively; and (b) a pair of lower knife contacts (47) at the ends of said bus bar members extending in the direction of said base plate, said lower knife contacts extending through the housing access slits of said rail mounting means into electrical engagement with the contact seats of the U-shaped conductive members of the associated rail mounting means respectively.

10. A power supply system as defined in claim 9, wherein a plurality of power switch modules and circuit breaker modules are associated with one of said bus bar modules for supplying power to a plurality of first loads (70), respectively; and further including a plurality of first plug means (44*b*) having knife contacts that extend through said bus bar cover member access slits into electrical engagement with the associated bus bar contact seats, respectively, and output plug contacts in electrical engagement with the input contacts of an associated one of said power switch modules.

11. A power supply system as defined in claim 10, and further including second plug means (44*a*) connecting the output terminals of said power switch modules with the input terminals of an associated one of said circuit breaker modules, respectively, and third plug means (44*c*) connecting the output terminals of said circuit breaker modules with an associated one of said first electrical loads (70).

12. A power supply system as defined in claim 9, and further including fourth plug means (37) associated with one of said bus bar modules for supplying single-phase power to one of a plurality of auxiliary loads (72), said fourth plug means having knife contacts extending through said bus bar cover member access slits into electrical engagement with the associated bus bar contact seats, respectively, and output conductors adapted for connection with an auxiliary electrical load.

13. A power supply system as defined in claim 12, wherein said fourth plug means includes a pair of plugs having knife contacts that engage the contact seats of a pair of said bus bars, respectively, thereby to provide single-phase power to said auxiliary electrical load.

14. A power supply system as defined in claim 12, wherein at least one of said first, second , third and fourth plug means includes locking means (52) for locking said plug means to the module connected thereto.

15. A power supply system as defined in claim 12, and further including lateral catch means (30, 39) for connecting at least some of said first, second and third plug means with the associated bus bar module.

16. A power supply system as defined in claim 9, wherein said power supply module includes:

(1) a hollow power supply module housing (35) having an enlarged supply portion (35*a*) containing a chamber (35*b*) for receiving the raised pedestal end portion of an adjacent first rail mounting member (8), and an auxiliary raised pedestal portion (13") having a top wall portion parallel with said base plate, said top wall portion containing a plurality of power supply access slits (15");

(2) conductor means (36) for supplying electrical power to contact seats arranged below said power supply access slits, respectively; and (3) mounting means (21,22) for mounting said power supply module housing on said support rail means;

(4) said auxiliary raised pedestal portion extending into the notch contained in an adjacent bus bar module, the bus bars of said adjacent bas bar module having end contacts that extend through said power supply access slits into electrical engagement with the power supply contact seats associated with said power supply access slits, respectively.

17. A power supply system as defined in claim 16, and further including locking means (32", 33") for locking said power supply module housing with the associated bus bar module and the associated rail mounting means.

18. A power supply system as defined in claim 16, wherein said first load is a three-phase electric motor; and further wherein said power supply module (34) includes three spaced supply conductors (36) and said auxiliary raised portion includes three power supply access slits (15"); said bus bar module including three bus bars having contacts connected with the power supply contact seats associated with the three power supply slits, respectively, whereby three-phase power is supplied from said three bus bars to said three-phase electric motor via said power switch module and said circuit breaker module.

19. A power supply system as defined in claim 9, wherein said bus bar module (23*a*) includes three rows of said access slits (55, 56, 57), said first plug means (44*a*') having knife edge contacts arranged to extend into said access slits to supply single-phase, two-phase, or three-phase electrical power to said load.

20. A power supply system as defined in claim 5, wherein said rail mounting means includes three of said U-shaped conductors the base portions of which are spaced and of different lengths, said U-shaped conductors being coplanar, having the same orientation, and being stacked telescopically within ore another in accordance with progressively decreasing size, the contact seats of said U-shaped conductors being contained in a common plane parallel with said base plate.

21. A power supply system as defined in claim 5, wherein said rail mounting means includes three of said U-shaped conductors the base portions of which have the same length and the leg portions of which have different lengths, respectively, said U-shaped conductors being coplanar and having the same orientation, the base portions of some of said U-shaped conductors extending through insulated slots (116') contained in the leg portions of at least one other U-shaped conductor, the contact seats of said U-shaped conductors being contained in a plane parallel with said base plate.

22. A power supply system as defined in claim 5, wherein said rail mounting means is a corner unit including a pair of raised pedestal portions (13', 14') connected by a right-angled bridging portion (12); and further wherein the base portion of each of said U-shaped conductors (16*a*, 16*a*') is bent intermediate its ends to define a pair of coplanar orthogonally arranged sections.

23. A power supply system as defined in claim 22, wherein the base portions of said U-shaped conductors (16*a*) are of different lengths and are bent adjacent the centers thereof to form sections of equal length, said U-shaped conductors being telescopically stacked within one another, the lengths of the leg portions of said U-shaped conductors being such that the contact seats at the free ends of the leg portions are contained in a common plane.

24. A power supply system as defined in claim 22, wherein the base portions of said U-shaped conductors (16*a*') are bent at different intermediated locations to define sections of different lengths, said U-shaped conductors being arranged within one another with the base portions of some of the U-shaped conductors extending through insulated slots (116*a*') contained in the leg portions of other U-shaped conductors.

25. A power supply system for supplying electrical power to a load, comprising:

(a) a base plate (7);

(b) linear support rail means (4, 5, 6) mounted on said base plate (c) a plurality of generally-rectangular bus bar modules (23, 23') each having a longitudinal axis and a pair of opposite ends;

(d) a power supply module (34); and (e) a plurality of rail mounting means (8, 9) mounting said power supply module and said bus bar modules in electrically connected relation on said support rail means, said bus bar modules extending longitudinally of the associated support rail means;

(f) wherein each of said rail mounting means and said power supply module includes mounting foot portions (19) directly connected with said base plate.

26. A power supply system as defined in claim 25, wherein each of said rail mounting means and said power supply module includes lug plate and foot means (21, 22) connected with an associated support rail.

* * * * *